United States Patent
Liao et al.

[11] Patent Number: 5,883,015
[45] Date of Patent: Mar. 16, 1999

[54] METHOD FOR USING OXYGEN PLASMA TREATMENT ON A DIELECTRIC LAYER

[75] Inventors: Kent Liao; Dinos Huang; Tuby Tu; Kuang-Chao Chen; Wen-Doe Su, all of Hsinchu, Taiwan

[73] Assignee: Mosel Vitelic Inc., Hsinchu, Taiwan

[21] Appl. No.: 887,886

[22] Filed: Jul. 3, 1997

[51] Int. Cl.$^6$ .................................................. H01L 21/316
[52] U.S. Cl. ....................... 438/788; 438/624; 438/631; 438/788; 438/789; 438/790; 438/763
[58] Field of Search ..................................... 438/624, 631, 438/788, 789, 790, 763

[56] References Cited

U.S. PATENT DOCUMENTS

| | | | |
|---|---|---|---|
| 5,554,570 | 9/1996 | Maeda et al. ........................... | 438/763 |
| 5,556,806 | 9/1996 | Pan et al. ................................ | 438/624 |
| 5,563,104 | 10/1996 | Jang et al. .............................. | 438/763 |
| 5,605,859 | 2/1997 | Lee ......................................... | 438/763 |
| 5,627,403 | 5/1997 | Bacchetta et al. ...................... | 257/639 |

*Primary Examiner*—Charles Bowers
*Assistant Examiner*—Thanh Nguyen
*Attorney, Agent, or Firm*—Christie, Parker & Hale, LLP

[57] ABSTRACT

The method for depositing a dielectric layer can be used to evenly deposit the dielectric layer to be applied to a semiconductor device. The method includes steps of: a) providing a substrate; b) depositing a first dielectric film on the subtrate; c) introducing an oxygen plasma for eliminating an uneven distribution of charges on a surface of the substrate; and d) forming a second dielectric film on the first dielectric film treated with the oxygen plasma for obtaining the dielectric layer having a uniform thickness on the substrate,

10 Claims, 2 Drawing Sheets

METHOD FOR USING OXYGEN PLASMA TREATMENT ON A DIELECTRIC LAYER

FIELD OF THE INVENTION

The present invention is related to a method for depositing a dielectric layer, and especially relates to a method for evenly depositing a dielectric layer which can be applied to the semiconductor device.

BACKGROUND OF THE INVENTION

During the process for manufacturing a semiconductor, the dielectric layer can be formed by deposition or non-deposition (e.g. thermal oxidation). For depositing the dielectric layer, there are many methods ranging from the early evaporation to the present physical vapor deposition (PVD) and chemical vapor deposition (CVD), among which the chemical vapor deposition is especially universal. The chemical vapor deposition can be classified into atmospheric pressure chemical vapor deposition (APCVD), sub-atmospheric pressure chemical vapor deposition (SACVD), low pressure chemical vapor deposition (LPCVD), and plasma enhanced chemical vapor deposition (PECVD). The major source of reaction gas containing silicon is silane ($SiH_4$) or tetra-ethylortho-silicate (TEOS).

For example, the dielectric layer, formed by low pressure chemical vapor deposition (LPCVD) using TEOS, is extensively used in the semiconductor device because of its good step coverage. However, it is graduately replaced by plasma enhanced chemical vapor deposition (PECVD) (at 400° C.) due to its requirement of high reaction temperature (650°~750° C.). On the other hand, during the process of the atmospheric pressure chemical vapor deposition (APCVD) using TEOS, the reaction can proceed at low temperature by introducing ozone.

Nevertheless, there are surface charge residues resulting from ion bombardment after the process of conventional PECVD using TEOS. It leads to an uneven deposition rate during the following process of APCVD or SACVD using TEOS and ozone so that the deposition thickness of the dielectric layer on the wafer varies with the distance to the center of the wafer, resulting in the difficulty with its following process.

SUMMARY OF THE INVENTION

An object of the present invention is to provide a method for evenly depositing a dielectric layer which can be applied to, the semiconductor device.

A method provided by the present invention for depositing a dielectric layer includes steps of: a) providing a substrate; b) depositing a first dielectric film on the subtrate; c) introducing an oxygen plasma for eliminating an uneven distribution of charges on a surface of the substrate, and d) forming a second dielectric film on the first dielectric film treated with the oxygen plasma for obtaining the dielectric layer having a uniform thickness on the substrate.

In accordance with an aspect of the present invention, the substrate has a polysilicon gate structure thereon.

In accordance with another aspect of the present invention, in the step (b), the first dielectric film is formed by a plasma enhanced chemical vapor deposition (PECVD).

In accordance with another aspect of the present invention, tetraethyl-ortho-silicate (TEOS) is a liquid source for the plasma enhanced chemical vapor deposition.

In accordance with another aspect of the present invention, the first dielectric film is made of silicon dioxide.

In accordance with another aspect of the present invention, in the step (c), a pressure of the introduced oxygen plasma is ranged between 3 and 14 torr.

In accordance with another aspect of the present invention, in the step (c), a pressure of the introduced oxygen plasma is 8.2 torr.

In accordance with another aspect of the present invention, in the step (d), the second dielectric film is formed by a chemical vapor deposition (CVD).

In accordance with another aspect of the present invention, the chemical vapor deposition is one selected from a group consisted of an atmospheric pressure chemical vapor deposition and a subatmospheric pressure chemical vapor deposition, both of which use ozone.

In accordance with another aspect of the present invention, tetra ethyl-ortho-silicate (TEOS) is a liquid source for the chemical vapor deposition.

In accordance with another aspect of the present invention, the second dielectric film is made of silicon dioxide.

The present invention may best be understood through the following description with reference to the accompanying drawings, in which:

DETAILED DESCRIPTION OF THE PREFERRED EMBODIMENT

Figure 1:
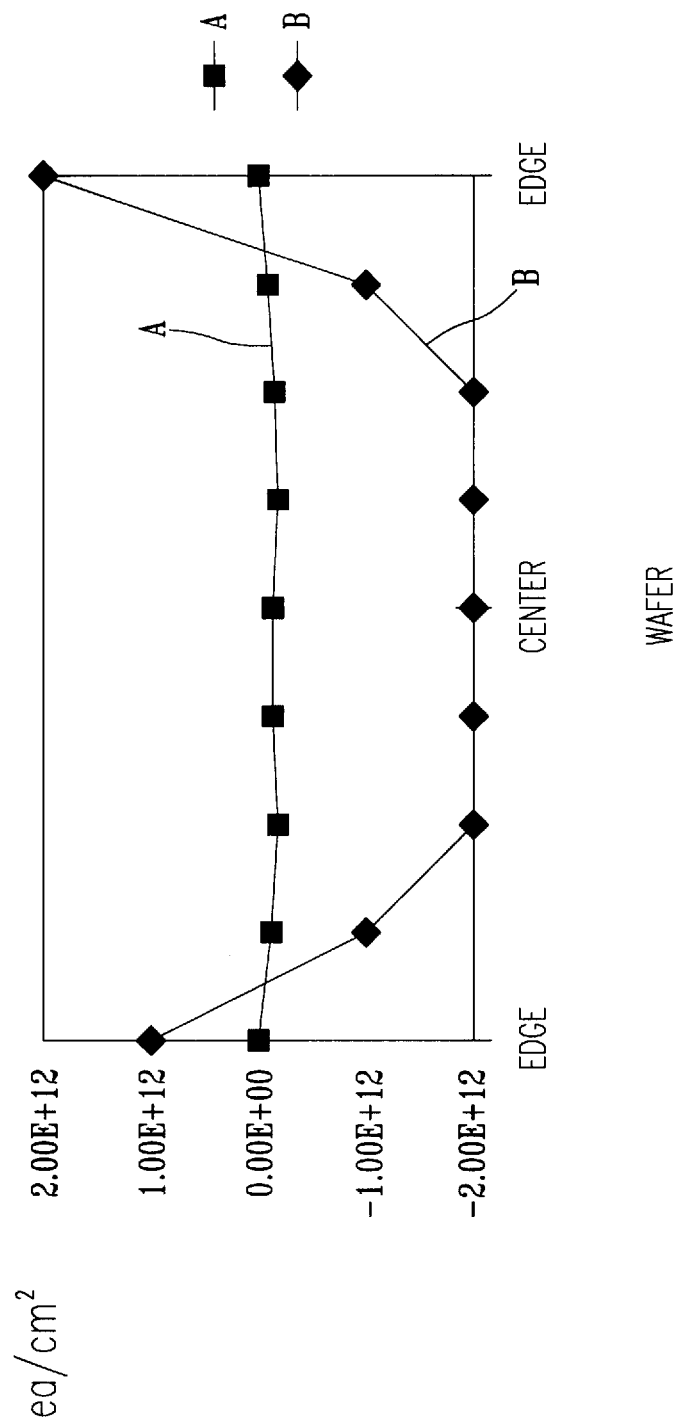
FIG. 1 is a comparison diagram of the oxide charge distribution of the dielectric layer between the conventional process and the present invention according to the data of surface charge analyzer, wherein the distance between the substrate and the plasma outlet is 280 mils; curve A is formed under 8.2 torr and curve B is formed under 1 torr.
Figure 2:
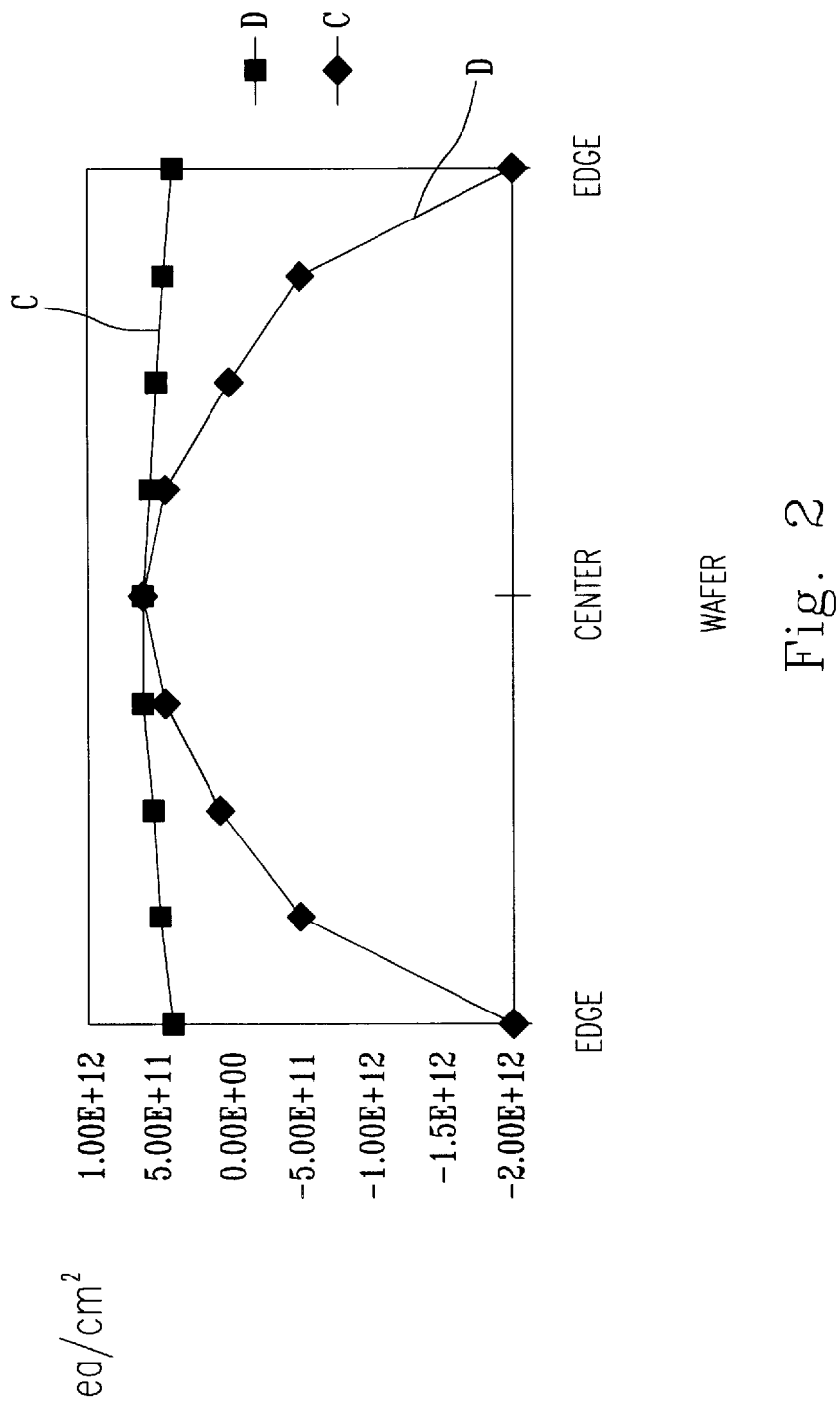
FIG. 2 is a comparison diagram for the oxide charge distribution of the dielectric layer between the conventional process and the present invention according to the data of surface charge analyzer, wherein the distance between the substrate and the plasma outlet is 780 mils; curve C is formed under 8.2 torr and curve D is formed under 1 torr.

In the process for manufacturing the semiconductor (e.g. the metal oxide semiconductor), the dielectric layer ($SiO_2$) is deposited through PECVD/TEOS procedure followed by APCVD/TEOS or SACVD/TEOS procedure using ozone. However, one skilled in the art has known that the thickness uniformity of $O_3$/TEOS process is closely related to the under layer formed during the PECVD/TEOS procedure. As described above, the deposition thickness of the dielectric layer on the wafer varies with the distance to the center of the wafer, as illustrated by curve B and D respectively shown in FIG. 1 and FIG. 2, resulting from charge residues after PECVD/TEOS process. FIG. 1 is a charge residue distribution diagram of the dielectric layer, wherein the distance between the substrate and the plasma outlet is 280 mils; curve A is formed under 8.2 torr and curve B is formed under 1 torr. FIG. 2 is a charge residue distribution diagram of the dielectric layer, wherein the distance between the substrate and the plasma outlet is 780 mils; curve C is formed under 8.2 torr and curve D is formed under 1 torr.

In conclusion, the present invention provides a method for depositing a dielectric layer which can evenly deposit the dielectric layer to be applied to the semiconductor device. The method of the present invention includes steps of: (a) providing a substrate; (b) depositing a first dielectric film on the, substrate; (c) introducing an oxygen plasma for eliminating an uneven distribution of charges on a surface of the substrate; and (d) forming a second dielectric film on the first dielectric film treated with the oxygen plasma for obtaining the dielectric layer having a uniform thickness on the substrate.

In a preferred embodiment of the present invention, the substrate is made of silicon, the desired dielectric layer is a silicon dioxide layer, and the reaction liquid source is tetra-ethyl-ortho-silicate (TEOS). It needs to introduce $O_2$ plasma under 3–14 torr at the end of PECVD/TEOS process wherein the $O_2$ plasma under 8.2 torr can efficiently eliminate the deviation of charge residue distribution to improve the thickness uniformity of the dielectric layer in the following $O_3$/TEOS process. Certainly, the used plasma can be replaced by $N_2O$ plasma or $N_2$ plasma.

According to curve A and C, compared with curve B and D respectively, the present invention provides a method which can greatly improves the defect of uneven charge distribution of the conventional method.

While the invention has been described in terms of what are presently considered to be the most practical and preferred embodiments, it is to be understood that the invention need not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A method for depositing a dielectric layer of a semiconductor device comprising steps of:
   a) providing a substrate;
   b) depositing a first dielectric film on said substrate;
   c) introducing an oxygen plasma for eliminating an uneven distribution of charges on a surface of said substrate at a pressure of from 3 to 14 torr; and
   d) forming a second dielectric film on said first dielectric film treated with said oxygen plasma for obtaining said dielectric layer having a uniform thickness on said substrate.

2. A method according to claim 1 wherein said substrate has a polysilicon gate structure thereon.

3. A method according to claim 1 wherein in said step (b), said first dielectric film is formed by a plasma enhanced chemical vapor deposition (PECVD).

4. A method according to claim 3 wherein tetra-ethyl-ortho-silicate (TEOS) is a liquid source for said plasma enhanced chemical vapor deposition.

5. A method according to claim 1 wherein said first dielectric film is made of silicon dioxide.

6. A method according to claim 1 wherein in said step (c), said oxygen plasma is introduced under a pressure of 8.2 torr.

7. A method according to claim 1 wherein in said step (d), said second dielectric film is formed by a chemical vapor deposition (CVD).

8. A method according to claim 7 wherein said chemical vapor deposition is one selected from a group consisted of an atmospheric pressure chemical vapor deposition and a sub-atmospheric pressure chemical vapor deposition, both of which use ozone.

9. A method according to claim 7 wherein tetra-ethyl-ortho-silicate (TEOS) is a liquid source for said chemical vapor deposition.

10. A method according to claim 1 wherein said second dielectric film is made of silicon dioxide.

* * * * *